US007315219B2

(12) United States Patent
Chiang

(10) Patent No.: US 7,315,219 B2
(45) Date of Patent: Jan. 1, 2008

(54) MULTIPHASE VOLTAGE CONTROLLED OSCILLATOR

(75) Inventor: Ming Cheng Chiang, Hsinchu (TW)

(73) Assignee: Realtek Semiconductor Corp., Hsin Chu (TW)

( * ) Notice: Subject to any disclaimer, the term of this patent is extended or adjusted under 35 U.S.C. 154(b) by 52 days.

(21) Appl. No.: 11/219,849

(22) Filed: Sep. 7, 2005

(65) Prior Publication Data

US 2006/0049879 A1    Mar. 9, 2006

(30) Foreign Application Priority Data

Sep. 7, 2004  (TW) .............................. 93127003 A

(51) Int. Cl.
H03K 3/03  (2006.01)
H03B 27/00  (2006.01)
(52) U.S. Cl. ........................... 331/57; 331/45; 327/269
(58) Field of Classification Search .................. 331/57, 331/45; 327/269
See application file for complete search history.

(56) References Cited

U.S. PATENT DOCUMENTS

| 4,337,529 | A | * | 6/1982 | Morokawa | .................... 377/20 |
| 4,727,597 | A | * | 2/1988 | Dautriche | .................... 455/333 |
| 5,180,994 | A | * | 1/1993 | Martin et al. | .................. 331/38 |
| 6,657,466 | B1 | | 12/2003 | Sudjian | |
| 6,657,502 | B2 | | 12/2003 | Bushman et al. | |
| 6,727,741 | B2 | | 4/2004 | Huang et al. | |
| 6,777,994 | B2 | * | 8/2004 | Chou et al. | .................. 327/269 |

* cited by examiner

Primary Examiner—Benny Lee
Assistant Examiner—Levi Gannon

(57) ABSTRACT

A multiphase voltage controlled oscillator includes at least one ring oscillating unit and a resistor ring; the ring oscillating unit is formed by connecting a plurality of phase-delay elements in cascade and the resistor ring is formed by connecting a plurality of resistor elements in cascade; wherein the connecting nodes of each ring oscillating unit are electrically connected to the connecting nodes of the resistor ring such that the ring oscillating unit can generate a plurality of oscillating signals with uniform phase differences.

20 Claims, 4 Drawing Sheets

MULTIPHASE VOLTAGE CONTROLLED OSCILLATOR

CROSS REFERENCE TO RELATED APPLICATION

This application claims the priority benefit of Taiwan Patent Application Serial Nunber 093127003, filed on Sep. 7, 2004, the full disclosure of which is incorporated herein by reference.

BACKGROUND OF THE INVENTION

1. Field of the Invention

This invention generally relates to a voltage controlled oscillator, and more particularly to a multiphase voltage controlled oscillator.

2. Description of the Related Art

Recently, multiphase voltage controlled oscillators (VCOs) have been widely applied to data-recovery systems and phase locked loop (PLL) circuits. A multiphase voltage controlled oscillator can output a plurality of oscillating signals, which have the same frequency but different phases, by controlling a voltage applied at its input, wherein the frequency of each oscillating signal is proportional to the voltage. Ideally, the phases of the oscillating signals outputted from the multiphase voltage controlled oscillator are spread uniformly throughout a range from 0 to 360 degrees so as to achieve an optimal control in applications.

A typical multiphase VCO is generally formed by N delay elements as shown in FIG. 1. The multiphase VCO 100 comprises N differential delay elements 102 serially connected to one another. Each differential delay element 102 has two inputs 102a, 102b and two outputs 102c, 102d, and is serially connected to one another so as to form a ring-type oscillator, such that the outputs 102c, 102d of all of the delay elements 102 can output a plurality of oscillating signals, which have the same frequency but different phases. In such a configuration, the number of the generated oscillating signals is determined by the number of the delay elements. Accordingly, if, for example, 32 oscillating signals are desired to be generated by the multiphase VCO 100, 16 differential delay elements 102 are required.

However, since each delay element has a predetermined signal delay time according to its electrical characteristics, the phase differences among the oscillating signals generated by the multiphase VCO 100 may be confined by the length of the predetermined signal delay time, such that even smaller phase differences cannot be obtained.

Generally, the conventional multiphase VCO adopts a phase interpolation approach in order to obtain smaller phase differences. Taking the multiphase VCO 100 shown in FIG. 1 for example, the phase interpolation approach can produce an extra oscillating signal between every two adjacent oscillating signals. Therefore, the multiphase VCO 110 using such a phase interpolation approach can generate more oscillating signals (i.e. more than 32) from the same 16 differential delay elements 102.

However, the uniformity of the phase differences generated through the phase interpolation approach is easily affected by manufacturing process variation or temperature fluctuation, and thus is difficult to achieve during high frequency and low frequency operations.

SUMMARY OF THE INVENTION

It is an object of the present invention to provide a multiphase voltage controlled oscillator, which adopts a simple circuit structure to generate more oscillating signals having uniformly distributed phase differences.

The embodiments according to the present invention disclose a multiphase voltage controlled oscillator for generating a plurality of oscillating signals having uniform phase differences. The multiphase voltage controlled oscillator comprises a plurality of ring oscillating units and a resistor ring. Each ring oscillating unit has a plurality of phase-delay elements and a plurality of first connecting nodes, wherein the phase-delay elements are electrically connected to one another through the first connecting nodes. The resistor ring has a plurality of resistor elements and a plurality of second connecting nodes, wherein the resistor elements are electrically connected to one another through the second connecting nodes. The second connecting nodes are respectively and electrically connected to the first connecting nodes such that the first connecting nodes can provide the oscillating signals having the same frequency but different phases.

The embodiments according to the present invention also disclose a multiphase voltage controlled oscillator which can provide a plurality of oscillating signals, having the same frequency but different phases, in accordance with a controlled voltage. The multiphase voltage controlled oscillator comprises a plurality of ring oscillating units each of which has a plurality of phase-delay elements serially connected to one another, and a phase clamping unit which has a plurality of connecting nodes respectively coupled to the phase-delay elements for clamping the phases of the oscillating signals.

BRIEF DESCRIPTION OF THE DRAWINGS

Other objects, advantages, and novel features of the present invention will become more apparent from the following detailed description when taken in conjunction with the accompanying drawings.

FIG. 3b is an equivalent circuit of the MOSFET transistor shown in FIG. 3a.

DETAILED DESCRIPTION OF THE PREFERRED EMBODIMENT

Figure 1:
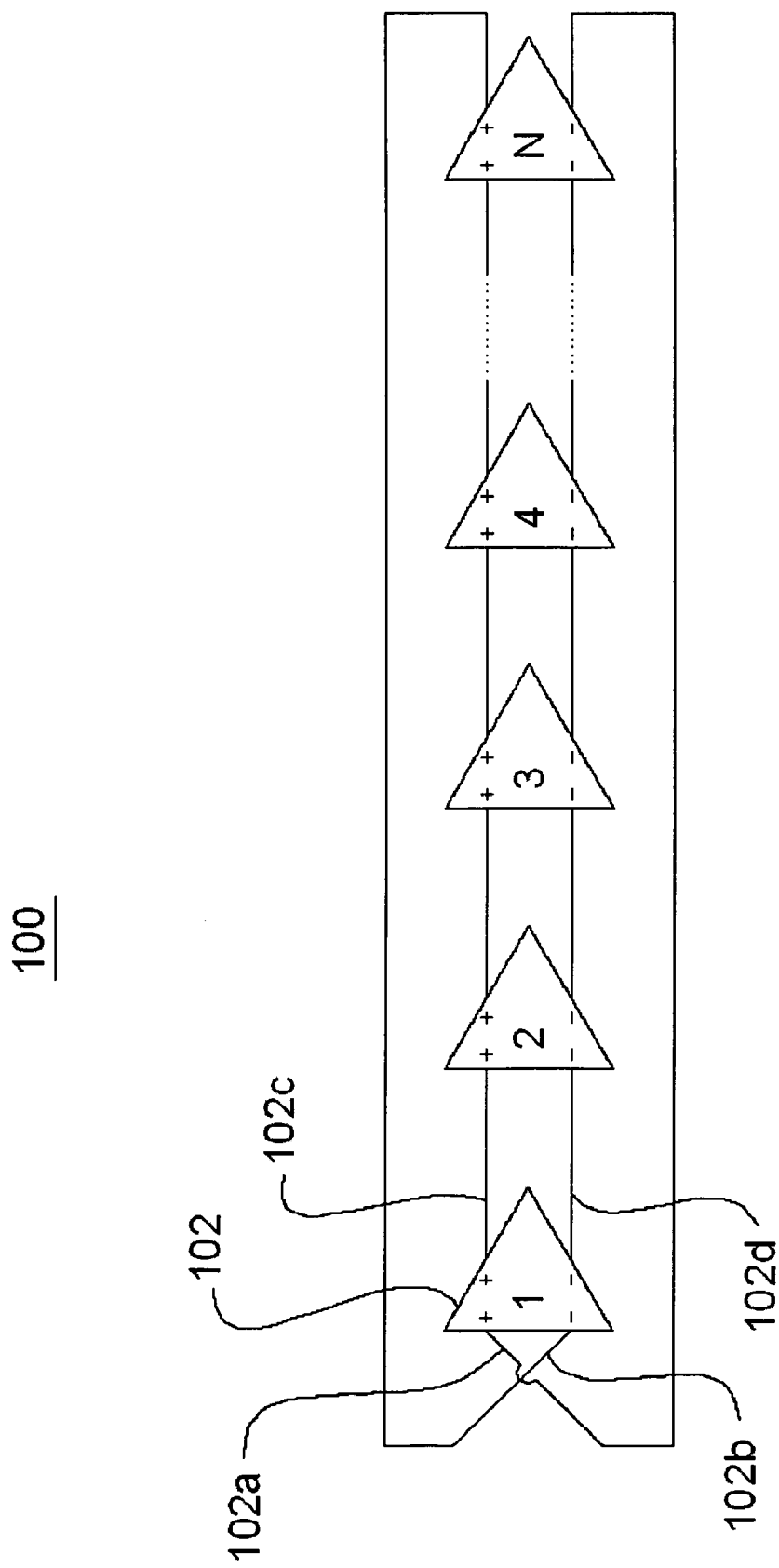
FIG. 1 is a schematic circuit structure of a conventional multiphase voltage controlled oscillator.
Figure 2:
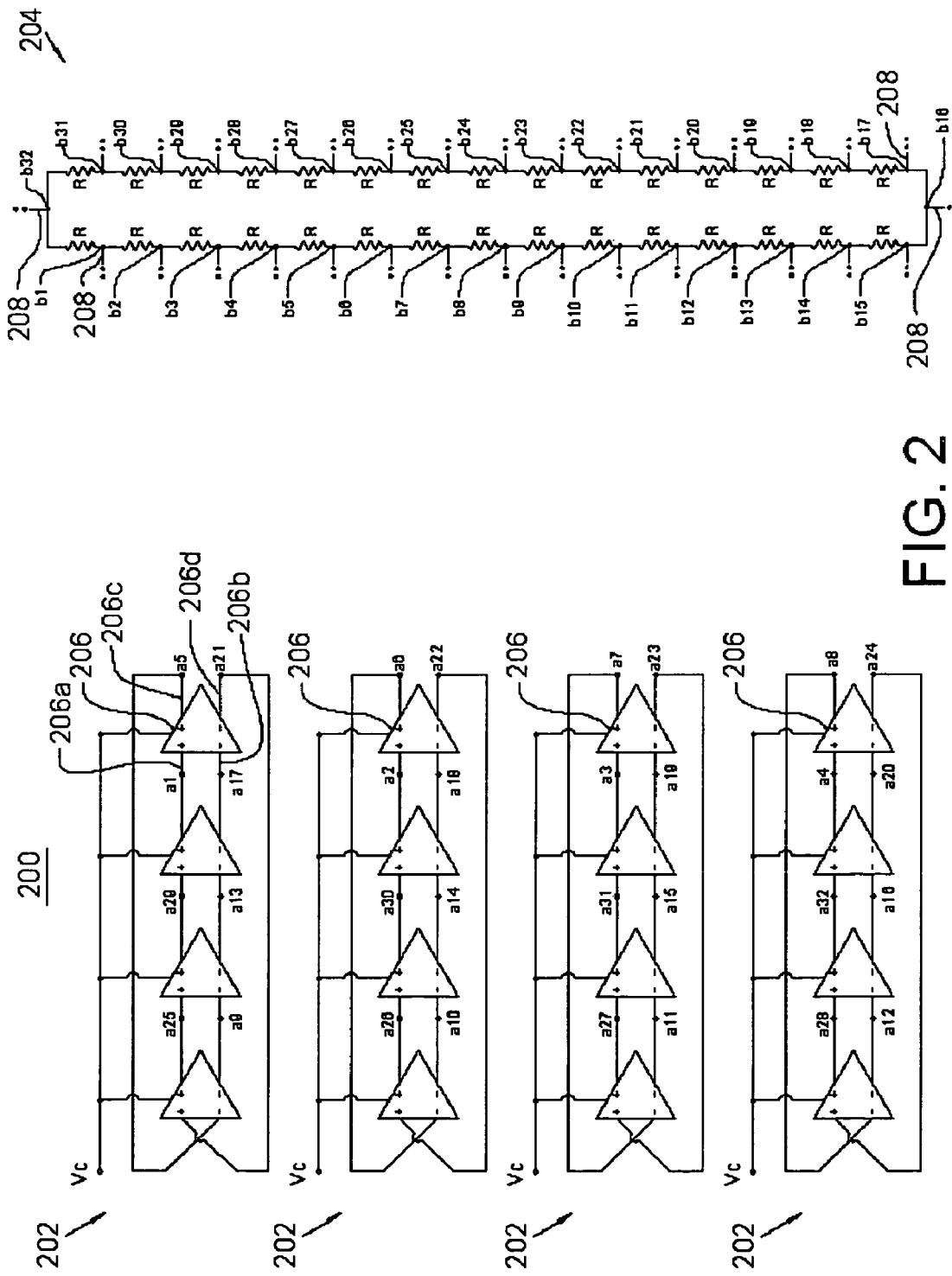
FIG. 2 is a schematic circuit structure of a multiphase voltage controlled oscillator according to one embodiment of the present invention.

Now referring to FIG. 2, it shows a schematic circuit structure of a multiphase voltage controlled oscillator 200 according to one embodiment of the present invention. In this embodiment, the multiphase voltage controlled oscillator 200 can provide 32 oscillating signals, which have the same frequency but different phases; the oscillating frequency of each oscillating signal is changed by adjusting a control voltage Vc.

In this embodiment, the multiphase voltage controlled oscillator 200 comprises four ring oscillating units 202 and a phase clamping unit 204. Each ring oscillating units 202 further comprises four differential delay elements 206, and each differential delay element 206 has two inputs 206a, 206b and two outputs 206c, 206d. Each differential delay element 206 has a predetermined signal delay time such that there exist a delay (i.e. phase difference) between the signals at the inputs 206a, 206b and the signals at the outputs 206c, 206d. In addition, the phase difference between the signals at the input 206a and 206b is 180 degree, and the phase difference between the signals at the outputs 206c and 206d is also 180 degree.

The differential delay element 206 in this embodiment adopts the control voltage Vc as its power supply voltage (i.e. Vdd). When the control voltage Vc is larger, the oscillating frequency of each oscillating signal is higher; when the control voltage Vc is smaller, the oscillating frequency of each oscillating signal is lower. The configuration and the operation principle of the differential delay element 206 are well known in the art, and therefore are not described herein in detail.

In each ring oscillating units 202, the outputs 206c, 206d of the first-stage (leftmost) differential delay element 206 are, respectively, electrically connected to the inputs 206a, 206b of the second-stage differential delay element 206; the outputs 206c, 206d of the second-stage differential delay element 206 are respectively electrically connected to the inputs 206a, 206b of the third stage differential delay element 206; and the outputs 206c, 206d of the third-stage differential delay element 206 are respectively electrically connected to the inputs 206a, 206b of the fourth-stage differential delay element 206 in the same manner. Finally, the outputs 206c, 206d of the fourth-stage (rightmost) differential delay element 206 are respectively electrically connected to the inputs 206b, 206a of the first-stage (leftmost) differential delay element 206 in a manner where opposite polarities are connected together, thereby forming the ring oscillating units 202.

In the above configuration, the four ring oscillating units 202 altogether define 32 connecting nodes, respectively labeled as a1 through a32, as shown in FIG. 2. Every two connecting nodes are defined at the connections between the outputs 206c, 206d and the inputs 206a, 206d of every two serially connected differential delay elements 206. More specifically, each differential delay element 206 is electrically connected to its next-stage differential delay element 206 through two of the connecting nodes a1-a32.

The phase clamping unit 204 is coupled to the 32 connecting nodes a1-a32 of the ring oscillating units 202 and is used for clamping the phases of the oscillating signals respectively at a plurality of specific phase angles according to its electrical characteristics, thereby achieving distribution uniformity of phase differences among the oscillating signals. As shown in FIG. 2, the phase clamping unit 204 can be implemented by using a resistor ring comprising a plurality of resistors.

The resistor ring 204 comprises 32 resistors R and 32 connecting nodes b1 to b32, wherein the resistors R are serially connected to one another through the connecting nodes b1 to b32, so as to form a ring-type structure. In this embodiment, the resistors R have substantially the same resistance value.

In this embodiment, the connecting nodes b1-b32 of the resistor ring 204 are respectively electrically connected to the connecting nodes a1-a32 of the ring oscillating units 202 through wirings (not shown); that is, b1 is connected to a1, b2 is connected to a2, . . . and b32 is connected to a32. In this connection manner, the four ring oscillating units 202 are electrically connected to one another through the connecting nodes b1-b32 of the resistor ring 204, thereby forming the multiphase voltage controlled oscillator 200. The 32 oscillating signals provided by the multiphase voltage controlled oscillator 200 are outputted from the outputs 206c, 206d (i.e. the connecting nodes a1-a32) of all of the differential delay elements 206.

In the multiphase voltage controlled oscillator 200, the resistors R of the resistor ring 204 function as connecting devices for connecting the four ring oscillating units 202, and have substantially the same resistance value such that the 32 oscillating signals provided by the outputs 206c, 206d (i.e. the connecting nodes a1-a32) of all of the differential delay elements 206 can have uniformly distributed phase differences through the voltage dividing effect of the resistors R. In such a configuration of the embodiment, the oscillating signals read out from two adjacent nodes (e.g. b1 and b2) of each resistor R have adjacent phases.

Although the disclosure above only describes one embodiment of coupling manner between the ring oscillating units 202 and the phase clamping unit (i.e. resistor ring) 204, one skilled in the art should understand that other coupling manners, which can achieve the phase clamping effect and uniformly distributed phase differences without departing from the spirit of the invention, will fall into the scope of the invention.

Figure 3A:
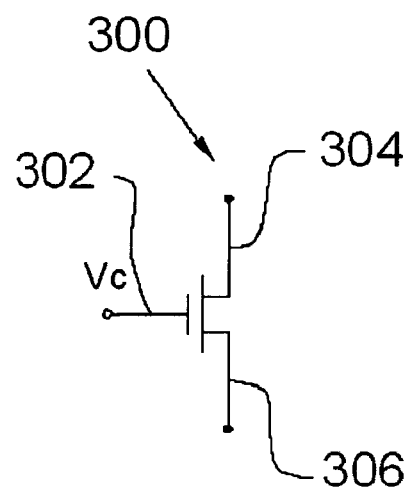
FIG. 3a shows a MOSFET transistor for implementing a resistor element R.
Figure 3B:
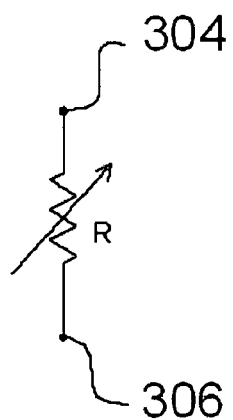

Each resistor R of the resistor ring 204 can be implemented by metal line or poly-silicon line. In the above embodiment, each resistor R can also be implemented by MOSFET, such as the NMOS transistor 300 shown in FIG. 3a. The MOSFET 300 includes a gate electrode 302, a drain electrode 304, and a source electrode 306, and a voltage is applied to the gate electrode 302 for controlling the equivalent resistance value of the MOSFET 300. FIG. 3b is an equivalent circuit of the MOSFET shown in FIG. 3a. In this embodiment, the control voltage Vc for controlling the oscillating frequency can also be applied to the gate electrode 302 as shown in FIG. 3a, so as to control the resistance value of an equivalent resistor R between the drain electrode 304 and the source electrode 306. In such a manner, when a lower control voltage Vc is set for decreasing the oscillating frequency, it can increase the resistance value of the resistor R of the resistor ring 204 such that the ring oscillating units 202 can more easily start to oscillate; while when a higher control voltage Vc is set for increasing the oscillating frequency, it can decrease the resistance value of the resistor R of the resistor ring 204 so as to improve oscillating characteristics.

It should be noted that the ring oscillating units 202 of the embodiment is not limited to be implemented by the differential delay elements each having two inputs and two outputs, and other circuit combinations formed by, for example, inverters each having only a single input and a single output, can also achieve the same objective. Although the phase clamping unit 204 in this embodiment is implemented by a resistor ring, other circuit configurations having a similar phase-clamping function can also be adopted. In addition, the number of the ring oscillating units 202 and the number of the delay elements within each ring oscillating unit 202 are not limited to four, and other numbers can also achieve the same objective.

Figure 4:
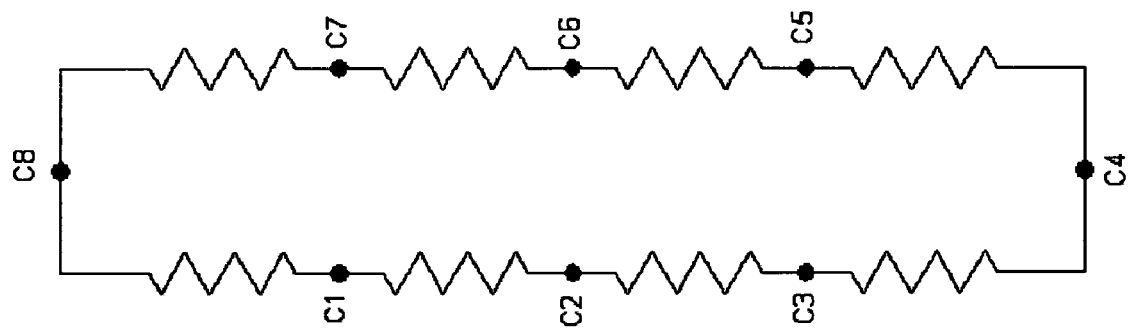
FIG. 4 is a schematic circuit structure of a multiphase voltage controlled oscillator according to another embodiment of the present invention.
Figure 4:
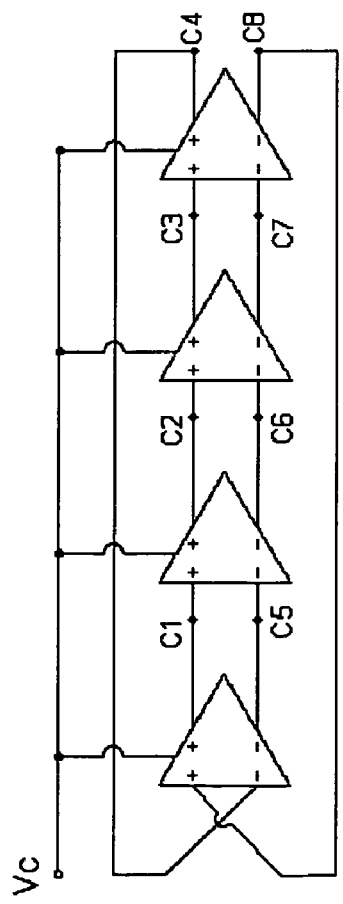

Even only a single ring oscillating unit can achieve the same objective. Now referring to FIG. 4, it shows a schematic circuit structure of a multiphase voltage controlled oscillator, which only uses a ring oscillating unit, according to another embodiment of the present invention. Since the operation principle of the multiphase voltage controlled oscillator is similar to that of the previous embodiment and should be understood by the skilled in the art, it will not be described herein in detail.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A multiphase voltage controlled oscillator for providing a plurality of signals having the same frequency but different phases according to a control voltage, the multiphase voltage controlled oscillator comprising:
 a plurality of ring oscillating units, each having a plurality of phase-delay elements and a plurality of first connecting nodes wherein the phase-delay elements in each of said ring oscillating units are electrically series-connected to one another though the first connecting nodes; and
 a single resistor ring having a plurality of resistor elements and a plurality of second connecting nodes wherein the resistor elements are electrically series-connected to one another through the second connecting nodes;
 wherein the second connecting nodes are respectively and electrically connected to the first connecting nodes of said ring oscillating units such that the first connecting nodes of said ring oscillating units provide the plurality of signals having the same frequency but different phases.

2. The multiphase voltage controlled oscillator as claimed in claim 1, wherein each of the phase-delay elements is an inverter.

3. The multiphase voltage controlled oscillator as claimed in claim 1, wherein each of the phase-delay elements is a differential delay elements.

4. The multiphase voltage controlled oscillator as claimed in claim 1, wherein each of the resistor elements is implemented by a MOSFET transistor.

5. The multiphase voltage controlled oscillator as claimed in claim 4, wherein the MOSFET transistor has a gate electrode electrically connected to receive the control voltage and each of the phase-delay elements is also electrically connected to receive said control voltage.

6. The multiphase voltage controlled oscillator as claimed in claim 4, wherein the resistance values of the resistor elements are substantially the same.

7. The multiphase voltage controlled oscillator as claimed in claim 1, wherein the second connecting node at an end of each of the resistor elements of the resistor ring is directly electrically coupled to one of the first connecting nodes of one of said ring oscillating units, whereas the second connecting node at an opposite end of said resistor element is directly electrically coupled to one of the first connecting nodes of another one of said ring oscillating units.

8. A multiphase voltage controlled oscillator, which can provide a plurality of signals having the same frequency but different phases according to a control voltage, the multiphase voltage controlled oscillator comprising:
 a plurality of ring oscillating units, each of the ring oscillating units having a plurality of phase-delay elements which are electrically series-connected to one another and output the plurality of signals; and
 a phase clamping unit having a plurality of connecting nodes wherein the connecting nodes are respectively coupled to the phase-delay elements thereby clamping the phases of the signals outputted from the phase-delay elements.

9. The multiphase voltage controlled oscillator as claimed in claim 8, wherein the control voltage controls the phase-delay elements thereby changing the frequency of the signals outputted from the phase-delay elements.

10. The multiphase voltage controlled oscillator as claimed in claim 8, wherein the phase clamping unit comprises a plurality of resistor elements.

11. The multiphase voltage controlled oscillator as claimed in claim 10, wherein each of the resistor elements is implemented by a MOSFET transistor having a gate electrode.

12. The multiphase voltage controlled oscillator as claimed in claim 11, wherein the control voltage is applied to the gate electrode for controlling the resistance values of the resistor elements.

13. The multiphase voltage controlled oscillator as claimed in claim 10, wherein at least one of the resistor elements is coupled between two of the ring oscillating units.

14. The multiphase voltage controlled oscillator as claimed in claim 10, wherein the resistor elements are electrically series-connected to one another so as to form a resistor ring.

15. The multiphase voltage controlled oscillator as claimed in claim 14, wherein each of the resistor elements of said resistor ring has two opposite ends directly electrically coupled to two different said ring oscillating units, respectively.

16. A multiphase oscillator for providing a plurality of signals having the same frequency but different phases, the multiphase oscillator comprising:
 a first ring oscillating unit having a plurality of first phase-delay elements which are electrically series-connected to one another and output a first subset of the plurality of signals;
 a second ring oscillating unit having a plurality of second phase-delay elements which are electrically series-connected to one another and output a second subset of the plurality of signals; and
 a phase clamping unit having a plurality of phase clamping elements, each of the plurality of phase clamping elements being coupled between one of the first ring oscillating units and one of the second ring oscillating units, respectively.

17. The multiphase oscillator as claimed in claim 16, wherein the phase clamping unit comprises a ring structure, and the plurality of phase clamping elements constitute a portion of the ring structure.

18. The multiphase oscillator as claimed in claim 17, wherein the ring structure is a resistor ring, and each of the plurality of phase clamping elements is a resistor element.

19. The multiphase oscillator as claimed in claim 16, wherein each of the first phase-delay elements and the second phase-delay elements receives a control voltage which determines the frequency of the plurality of signals.

20. The multiphase oscillator as claimed in claim 19, wherein each of the phase clamping elements receives the control voltage.

* * * * *